(12) United States Patent
Wakamatsu et al.

(10) Patent No.: US 7,871,590 B2
(45) Date of Patent: Jan. 18, 2011

(54) MASS OF SILICON SOLIDIFIED FROM MOLTEN STATE AND PROCESS FOR PRODUCING THE SAME

(75) Inventors: Satoru Wakamatsu, Shunan (JP); Junichirou Nakashima, Shunan (JP); Shigeki Sugimura, Shunan (JP)

(73) Assignee: Tokuyama Corporation, Shunan-shi (JP)

( * ) Notice: Subject to any disclaimer, the term of this patent is extended or adjusted under 35 U.S.C. 154(b) by 510 days.

(21) Appl. No.: 11/597,222

(22) PCT Filed: May 23, 2005

(86) PCT No.: PCT/JP2005/009358

§ 371 (c)(1), (2), (4) Date: Nov. 21, 2006

(87) PCT Pub. No.: WO2005/113436

PCT Pub. Date: Dec. 1, 2005

(65) Prior Publication Data

US 2008/0038177 A1    Feb. 14, 2008

(30) Foreign Application Priority Data

May 21, 2004    (JP) ............................. 2004-152189

(51) Int. Cl.
*C01B 33/02*    (2006.01)
*B29B 9/00*    (2006.01)
*B22F 9/00*    (2006.01)
*C30B 29/06*    (2006.01)

(52) U.S. Cl. ....................... 423/349; 423/348; 423/350; 264/13; 264/14; 75/340; 75/341; 428/402; 428/613; 117/77

(58) Field of Classification Search ......... 423/348–350; 264/13, 14; 75/340, 341; 428/402, 613; 117/77
See application file for complete search history.

(56) References Cited

U.S. PATENT DOCUMENTS 6,299,682 B1 * 10/2001 Wakita et al. ................. 117/11

(Continued)

FOREIGN PATENT DOCUMENTS

CN    1372530 A    10/2002

(Continued)

*Primary Examiner*—David M. Brunsman
*Assistant Examiner*—Kevin M Johnson
(74) *Attorney, Agent, or Firm*—The Webb Law Firm

(57) ABSTRACT

A solidified mass for a high-purity multicrystal silicon material that is preferably applicable to producing crystal type silicon ingots for photo voltaics, and a process for producing the solidified mass are provided. The mass of silicon solidified from molten state is a solidified mass produced by dropping molten silicon into a receiving vessel and allowing the vessel to receive the molten silicon, said solidified mass containing bubbles and having (i) an apparent density of not less than 1.5 g/cm$^3$ and not more than 2.2 g/cm$^3$ and (ii) a compressive strength of not less than 5 MPa and not more than 50 MPa. The process for producing a mass of silicon solidified from molten state includes the steps of dropping molten silicon into a receiving vessel and allowing the vessel to receive the molten silicon, wherein the surface temperature of the vessel for receiving the molten silicon is not lower than 0° C. and not higher than 1000° C., and the receiving vessel is allowed to receive the molten silicon at a rate of $1\times10^{-3}$ to $5\times10^{-1}$ g/sec·cm$^2$.

2 Claims, 1 Drawing Sheet

U.S. PATENT DOCUMENTS

| | | |
|---|---|---|
| 6,784,079 B2 | 8/2004 | Wakamatsu et al. |
| 6,861,144 B2 | 3/2005 | Wakamatsu et al. |
| 2002/0104474 A1 * | 8/2002 | Wakamatsu et al. ............ 117/2 |

FOREIGN PATENT DOCUMENTS

| | | | |
|---|---|---|---|
| JP | 6064913 A | 3/1994 |
| JP | 11180710 A | 7/1999 |
| JP | 11314996 A | 11/1999 |
| JP | 2002316813 A | 10/2002 |
| JP | 2003104711 A | 4/2003 |
| WO | 02100777 A1 | 12/2002 |

* cited by examiner

MASS OF SILICON SOLIDIFIED FROM MOLTEN STATE AND PROCESS FOR PRODUCING THE SAME

TECHNICAL FIELD

The present invention relates to a solidified mass for a high-purity multicrystal silicon material that is preferably applicable to producing crystal type silicon ingots for photo voltaics and a process for producing the solidified mass. More particularly, the invention relates to a mass of silicon solidified from molten state, a melting time of which can be shortened to enhance production efficiency of silicon ingots in an ingot production process, and a process for producing the solidified mass.

BACKGROUND ART

The main stream of photo voltaics produced at present is silicon crystal type. In the production process of the crystal type photo voltaics, there are various steps of an ingot-making step wherein a high-purity silicon material is temporarily melted and then resolidified, a block-making or wafer-making step wherein the resulting ingot is subjected to cutting or slicing, a cell-making step wherein the resulting wafer is imparted with a function of battery, and a module-making step wherein the resulting cells are arranged to give a structure capable of being practically set up.

In the ingot-making step, two kinds of processes of a single crystallization process using CZ method and a multicrystallization process using casting method or Bridgman's method are known as typical processes. In any crystal type of single-crystal type and multicrystal type, the steps of a process for producing a silicon ingot are broadly classified into a step of packing a high-purity silicon material into a crucible every production batch to obtain one ingot, a step of supplying heat energy from the outer periphery of the crucible to melt the packing, a step of re-solidifying the melt with paying attention to crystal growth and a step of solidifying the resolidified silicon ingot and taking it out of the crucible.

In the ingot-making step, properties of the high-purity silicon material have great influence particularly on the time required for the step of melting the material among the above steps, and this greatly influences the ingot production efficiency itself.

As the high-purity silicon material, granular silicon having a particle diameter of about 1 mm that is produced by fluidized bed method, bar silicon obtained by breaking a silicon rod that is produced by Siemens method, crushed silicon obtained by crushing the bar silicon into fragments of about 3 to 50 mm, scrap silicon mainly constituted of residues and scraps obtained in an ingot-making step, or the like is used at present.

When the granular or crushed silicon is used as the high-purity silicon material, an extremely large number of particles must be packed because the particles are small. However, a joint of particles therebetween has low thermal conductivity, and as the number of the particles packed is increased, the number of joints of particles becomes larger. Consequently, a layer of the packed particles inevitably has bad thermal conductivity, and heating of the whole packing layer to a temperature in the vicinity of the melting point requires an extremely long period of time.

Further, because the small particles themselves have a large surface area, they have properties that once the surrounds of the particles are exposed to a melt, the particles are melted relatively easily. In the packing state where joints of particles are present, however, there is a problem that if the temperature is raised to a certain extent in the heating process, the joints are sintered together to keep the shape of the packing, and the bad thermal conductivity is also continued. That is to say, even if melting of silicon begins at the inner periphery adjacent to a crucible heated, a packing layer of the joined small particles having a low temperature is still present inside the crucible, and a considerable time is required before every particle inside the packing layer is wetted by the melt.

For the above reason, in the use of a silicon packing layer of small particles, there are problems that a long period of time is required from the beginning of melting to the completion of melting and the production efficiency is low.

On the other hand, the bar silicon or the silicon mass itself has good thermal conductivity and is relatively rapidly heated to a temperature in the vicinity of the melting point, and melting of the silicon begins at the outer periphery of the silicon. Silicon, however, has a large quantity of latent heat of fusion (melting), so that even after the silicon mass is exposed to a melt having excellent thermal conductivity, the mass is gradually melted from its surface, and melting of the whole mass still requires a long period of time because the surface area of the mass is small for its volume.

In order to provide multicrystal silicon which does not do damage due to floating or falling of a silicon packing to a crucible when it is melted, Japanese Patent Laid-Open Publication No. 104711/2003 (patent document 1) discloses multicrystal silicon having a shape of a crucible, which is obtained by heat-melting a block of multicrystal silicon, crushed fragments thereof or a mixture of the block and the fragments in a crucible and then solidifying the silicon in the crucible to solidify and mold it in a shape of a crucible. In this process, however, a block of multicrystal silicon or the like is used, so that the problems that the apparent density is too high and much time is required to melt the silicon have not been solved.

In Japanese Paten Laid-Open Publication No. 314996/1999 (patent document 2), there is disclosed a process for producing silicon single crystals and multicrystals using a gas phase component material, more specifically, a process for producing crystals in which a heat-generating solid, a high-frequency coil arranged opposite to a lower surface of the heat-generating solid and at least one gas-supply opening arranged on the coil surface are provided and which comprises induction-heating the heat-generating solid by the high-frequency coil to a temperature of not lower than the melting point of a deposition component element or compound, blowing a raw material gas containing at least one kind of the component element onto the lower surface of the heat-generating solid through at least one of the gas-supply opening to perform deposition or melting of the component element or compound on the lower surface of the heat-generating solid, and dropping the deposited melt or allowing it to flow downwards from the lower part of the heat-generating solid to produce crystals.

In the patent document 2, it is also disclosed that the melt thus dropped is received by a crucible, and with feeding the melt to the crucible, a multicrystal ingot is produced. In the patent document 2, it is further disclosed that by the use of a seed crystal or a single-crystal ingot, crystal growth is performed by a pulling method from the melt in the crucible to produce a multicrystal or single-crystal ingot. However, if the resulting ingot is taken out, the ingot exhibits a too high apparent density, and it takes an extremely long time to completely melt the ingot as previously described. Moreover, it is also suggested to feed the melt to the vessel drop by drop.

However, as can be seen from the description that the vessel is heated and held, the apparent density of the resulting multicrystal silicon is high and a long period of time is sometimes required for melting.

In Japanese Patent Laid-Open Publication No. 316813/2002 (patent document 3), the present applicant has proposed a multicrystal silicon foam containing bubbles inside and having an apparent density of not more than 2.20 g/cm$^3$. The silicon foam prepared by the process of this publication has an apparent density of the same level as that of the mass of the present invention, but it differs in that individual particles are smaller than those of the present invention. Depending upon the preparation conditions, the foams are fusion-bonded to one another to form a mass in certain cases, but this mass is very brittle and its thermal conductivity is not always high. When the foam is applied to an ingot-making step, the melting rate is improved than before. However, development of a silicon mass capable of further enhancing the ingot production efficiency has been desired.

In WO02/100777 (patent document 4), the present applicant has disclosed a process for producing silicon, comprising a step wherein a surface of a substrate is heated to a temperature lower than the melting point of silicon and the substrate surface is brought into contact with silanes with maintaining the temperature to deposit silicon and a step wherein the temperature of the substrate surface is raised to melt a part or all of the deposited silicon and thereby drop the silicon from the substrate surface and the dropped silicon is recovered. More specifically, there are disclosed a process (process 1) wherein silicon deposited on an inner wall surface of a cylindrical heated member is partially melted at the interface between the silicon and the reactor and dropped, and a process (process 2) wherein the whole amount of silicon deposited on a surface of a bar or V-shaped heated member is melted and dropped.

In the process 1, however, because the deposited silicon is melted at the interface between the silicon and the reactor, most of the silicon is dropped in an unmolten state, and therefore, the apparent density tends to become high. Actually, in Examples 1 to 5, a part of a deposit was melted and dropped, and in these examples, the apparent density of the resulting silicon exceeded 2.3 g/cm$^2$.

The process 2 is a process wherein the whole amount of the deposited silicon is melted and dropped, and in Examples 6 and 7 shown as specific examples of the process, a melt of silicon fell dropwise owing to the shape of the heated member or the melting conditions, and the resulting silicon was close to the aforesaid silicon foam, so that there is room for improvement in strength and thermal conductivity.

As described above, the multicrystal silicon heretofore proposed has a disadvantage that when melting of the silicon is intended to produce an ingot, the silicon is hardly melted, and a long time is required for melting. On this account, there are problems of bad production efficiency and high energy cost. Further, there is another problem that if the temperature is raised to promote melting, a crucible itself is damaged to thereby inhibit normal ingot-making operations.

Patent document 1: Japanese Paten Patent Laid-Open Publication No. 104711/2003

Patent document 2: Japanese Paten Patent Laid-Open Publication No. 314996/1999

Patent document 3: Japanese Paten Patent Laid-Open Publication No. 316813/2002

Patent document 4: WO02/100777

DISCLOSURE OF THE INVENTION

Problems to be Solved the Invention

There has been desired development of a high-purity multicrystal silicon material having high thermal conductivity and capable of being melted by heating in a short period of time and a process for producing the same.

Accordingly, it is an object of the present invention to provide a high-purity multicrystal silicon material a melting time of which can be shortened in an ingot-making step and a process for producing the same.

SUMMARY OF THE INVENTION

In order to solve the above problems, the present inventors have earnestly studied, and as a result, they have found that a mass of silicon solidified from molten state, which has a specific compressive strength and a specific apparent density, shows such excellent thermal conductivity as that of a mass when the temperature is raised and has such a large surface area as that of small particles when it is melted, so that it is possible to reconcile rapid temperature rise and rapid melting, and this solidified mass is remarkably excellent as a high-purity silicon material. Based on the fining finding, the present invention has been accomplished.

(1) That is to say, the mass of silicon solidified from molten state according to the present invention is a solidified mass which contains bubbles and is produced by dropping molten silicon into a receiving vessel and allowing the vessel to receive the molten silicon, said solidified mass having:

(i) an apparent density of not less than 1.5 g/cm$^3$ and not more than 2.3 g/cm$^3$, and (ii) a compressive strength of not less than 5 MPa and not more than 50 MPa.

(2) The mass preferably has a volume of not less than 50 cm$^3$.

(3) The shape of the mass preferably closely resembles a shape of a crucible used for producing a silicon ingot.

The high-purity silicon material having such novel properties is a mass containing bubbles to a certain extent. When the mass is packed into a crucible, it has thermal conductivity of the same level as that of a conventional mass. Therefore, when the temperature is raised, the whole of the packing is rapidly heated to a temperature in the vicinity of the melting point. Further, because the mass contains bubbles, it undergoes self-collapse (self-breaking) immediately before melting and spontaneously increases its own surface area to increase a contact area with a melt. As a result, the whole of the packing is very efficiently melted.

The present inventors have further continued studies and succeeded in finding a process for producing a mass of silicon solidified from molten state having excellent reproducibility and containing bubbles with good controllability. That is to say, the present inventors have found that the mass containing bubbles can be produced by properly adjusting a relationship between the dropping rate of molten silicon and the preset conditions of a receiving vessel for solidifying and condensing the molten silicon in the mass production process comprising dropping the molten silicon into the receiving vessel and solidifying it in the vessel.

(4) The process for producing a mass of silicon solidified from molten state according to the present invention is a process comprising melting silicon in an atmosphere containing hydrogen and nitrogen, dropping the molten silicon into a receiving vessel and allowing the vessel to receive the molten silicon, wherein:

the surface temperature of the vessel for receiving the molten silicon is not lower than 0° C. and not higher than 1000° C., and the receiving vessel is allowed to receive the molten silicon at a rate of $1 \times 10^{-3}$ to $5 \times 10^{-1}$ g/sec cm$^2$.

(5) The molten silicon is preferably one obtained by bringing hydrogen and silane into contact with each other on a deposition surface having a temperature of 600 to 1700° C. to deposit silicon in a solid state or a molten state and melting substantially all the deposited silicon.

(6) The shape of the receiving vessel preferably closely resembles a shape of a crucible used in an ingot-making step.

By the use of the mass of the invention, it becomes possible to reconcile rapid temperature rise and rapid melting in an ingot-making step, and therefore, it becomes possible to efficiently carry out mass production and increased production of silicon ingots.

BEST MODE FOR CARRYING OUT THE INVENTION

Figure 1:
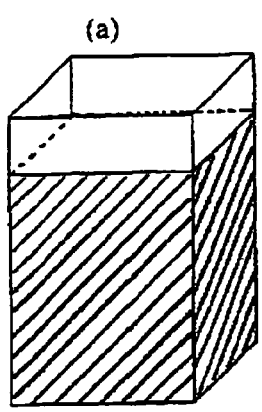
FIGS. 1(a)-1(c) are a group of schematic views each of which shows an internal surface area of a receiving vessel in the present invention.
Figure 1:
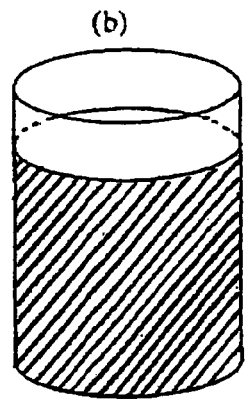
Figure 1:
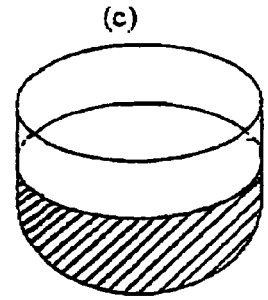

Mass of Silicon Solidified from Molten State

The mass of silicon solidified from molten state of the invention is solidified mass which is produced by dropping molten silicon into a receiving vessel and allowing the vessel to receive the molten silicon, said solidified mass containing bubbles and having:

(i) an apparent density of not less than 1.5 g/cm$^3$ and not more than 2.3 g/cm$^3$, and (ii) a compressive strength of not less than 5 MPa and not more than 50 MPa.

The bubbles contained in the mass of the invention are important factors in increase of a melting rate. That is to say, after the temperature of the mass is sufficiently raised owing to excellent thermal conduction, the mass spontaneously collapses and becomes small particles by virtue of breaking force due to thermal expansion of the bubbles to increase the surface area, and the small particles easily come into contact with a melt. The size of each bubble is in the range of usually 0.1 μm to 2 mm.

The breaking (collapsing) mechanism of the mass includes not only the aforesaid thermal expansion of bubbles but also strain present in the mass though the strain is not visually confirmed. It is presumed that the strain occurs between laminated layers when a mass of a dropping melt is laminated one after another, and it is thought that the strain grows to a crack owing to a stress of thermal expansion.

If the mass is a huge one such as a silicon rod, its internal strain can be measured by a strain gauge or the like, but because the masses of the invention have various sizes, measurement with a strain gauge is difficult. In order to quantitatively express ease of breaking of the mass, therefore, compressive strength is introduced as an indication in the present invention.

(i) Apparent Density

The bubbles that induce self-breaking of the mass when the mass is heat-melted are considered to be closed cells isolated from an external atmosphere, taking the above mechanism into consideration. Accordingly, the apparent density of the mass of the invention is defined and measured by the following measuring method.

Apparent density=[Weight (g) of mass]/[Displacement (cm$^3$) of mass immersed in water]

It is desirable that the mass of silicon solidified from molten state disclosed in the invention is taken out of a closed vessel for producing the mass and measured as such on the apparent density by the method shown by the above formula. The mass, however, is sometimes crushed in order to facilitate transportation and handling, and for measuring an apparent density of the crushed silicon, it is possible that 10 crushed silicon fragments each having a volume of not less than 1 cm$^3$ are selected at random as samples and they are measured on the apparent density.

In order to shorten a melting time in an ingot-making step, the apparent density of the mass of the invention needs to be not more than 2.3 g/cm$^3$, preferably not more than 2.2 g/cm$^3$. When the apparent density is in the above range, the mass is easily broken in the melting process.

If the apparent density is too low, heat is not sufficiently conducted on certain occasions because of too many gaps. On this account, the apparent density is desired to be not less than 1.5/cm$^3$, more preferably not less than 1.8 g/cm$^3$, in order to sufficiently keep the thermal conductivity of the mass.

The bubbles in the invention are considered to be formed by the following two mechanisms.

That is to say, it is thought that one mechanism of formation of bubbles in the mass of silicon solidified from molten state of the invention is that when the silicon is melted, a gas (mainly hydrogen or nitrogen) is dissolved, and when the molten silicon is solidified, solubility is decreased to deposit bubbles inside the silicon solid, and the other mechanism is that a atmosphere gas is shut up at the interface or the gap between the dropped molten silicon and the solid surface (surface of receiving vessel or surface of mass of silicon solidified from molten state already accumulated) that is in contact with the molten to form bubbles (i.e., bubbles shut up among particles).

(ii) Compressive Strength

In the present invention, the compressive strength of the mass is desired to be not less than 5 MPa and not more than 50 MPa, preferably 10 to 50 MPa. If the compressive strength is too high, self-breaking under heating in an ingot-making step is not sufficient, and melting sometimes requires a long period of time. If the compressive strength is too low, the shape of the mass is liable to break when the mass is transported or handled, and hence, new problems such as contamination with impurities and troublesome after-treatment (e.g., packing) sometimes takes place.

In the present invention, the compressive strength is measured by the use of, for example, a Tensilon universal tester RTA-IT (trade name, manufactured by Orientec Co., Ltd.). Specifically, in the case where a mass produced is used as it is, 10 various parts of the mass are selected at random as samples, and in the case where the mass is used after crushed, 10 crushed fragments are selected at random as samples. Then, each sample is processed to a cube having a length of one side of 1 cm, and to the cube is gradually applied a load (e.g., 1 ton) by the Tensilon universal tester, and the load on the load cell is measured to determine a load at the peak of a wave form. When plural peaks occur in the measurement of one sample, the maximum load is adopted. The loads of the samples thus measured are averaged, and a compressive strength is calculated.

The compressive strength of a silicon mass produced by a bell-jar process or the like is about 70 to 80 MPa. The compressive strength of the silicon foam obtained in the patent document 3 is less than 5 MPa.

(iii) Size of Mass

The size of the mass of the invention is not specifically restricted provided that the above-mentioned apparent density and compressive strength are satisfied.

The mass of the invention has high thermal conductivity, so that lowering of thermal conductivity due to the bubbles contained makes substantially no matter, and hence, the temperature of the mass is rapidly raised even inside the mass.

If small particles are used, the thermal conductivity is sometimes lowered as previously described, so that in order to obtain economically effective reduction of a melting time, the mass of the invention desirably has a certain size or more. That is to say, in order to diminish influence of sintering of masses together to enhance thermal conduction of a packing layer in a crucible, the mass desirably has a size (volume) of preferably not less than 50 cm$^3$, more preferably not less than 100 cm$^3$, still more preferably not less than 1000 cm$^3$.

As the mass of the invention becomes larger, the thermal conductivity is increased to shorten a melting time, so that it is most preferable to allow the shape of the mass to closely resemble a shape of a crucible used in an ingot-making step, whereby the mass can be more efficiently melted.

By the use of such a mass of the invention, it becomes possible to reconcile rapid temperature rise and rapid melting in an ingot-making step, and therefore, it becomes possible to efficiently carry out mass production and increased production of silicon ingots.

Method of Packing Mass into Crucible

In order that the effect given by the use of the mass of the invention may be effectively exerted, the volume occupied by the mass in a crucible is desirably as large as possible. In a most preferred embodiment, the volume occupied by the mass in a crucible is almost equal to the volume of the crucible. For achieving this embodiment, the size of the mass is made the same as that of an ingot-making crucible, or the mass is crushed or cut to such an extent as the handling is easy and the resulting fragments are closely packed in combination into a crucible leaving no space among the fragments.

In order that the effect of the invention may be more effectively exerted, the mass is desirably packed into a crucible in such a manner that the volume occupied by the mass in the crucible is preferably at least 50%, more preferably at least 70%. In this case, the crucible may be packed with one mass or a large number of masses each having a volume of not less than 100 cm$^3$. Increase of the occupation ratio of the mass to the crucible volume in the above manner contributes to increase of the amount of the silicon packing in the crucible and is preferable.

When the mass is packed into a crucible in an ingot-making step, only the mass may be packed into the crucible, or if gaps are formed when the mass is packed into the crucible, the mass may be used together with granular silicon, crushed silicon, silicon foam or the like.

The mass of silicon solidified from molten state of the invention can be produced by the following process.

Process for Producing Mass

The process for producing a mass of silicon solidified from molten state according to the invention is a process comprising dropping molten silicon into a receiving vessel and allowing the vessel to receive the molten silicon, wherein:

the surface temperature of the vessel for receiving the molten silicon is not lower than 0° C. and not higher than 1000° C., and the receiving vessel is allowed to receive the molten silicon at a rate of $1\times10^{-3}$ to $5\times10^{-1}$ g/sec·cm$^2$.

With regard to the unit "g/sec·cm$^2$" of the receiving rate used herein, the area of the denominator means an area of an inner surface of the receiving vessel that comes into contact with the silicon, and this contact area in the invention is defined as follows. That is to say, when it is supposed that the silicon to be received by the molten silicon-receiving vessel assumed as solid silicon having a horizontal flat upper surface and having a true density (2.33 g/cm$^3$), is solidified and packed therein, the area of an inner surface of the receiving vessel that comes into contact with the silicon is the contact area in the invention. The state of the contact area is shown in, for example, FIG. 1(a) to FIG. 1(c).

By the way, the area of the receiving vessel that practically comes into contact with the solidified mass of silicon differs a little from the area defined above, depending upon the content of bubbles in the mass and the degree of horizontalness and flatness of the upper surface, but according to the definition of the production process of the invention, such a difference is thought to be substantially no matter.

The shape of the receiving vessel is not specifically restricted, and it may be any of prismatic shape, cylindrical shape and bowl shape, as shown in FIG. 1.

In the case where the mass of silicon solidified from molten state is already present in the receiving vessel, the molten silicon can be further dropped on or around the mass to give an accumulation. When such an operation is carried out, the shape of the receiving part of the receiving vessel is considered to be a shape containing the silicon mass so that in the calculation of the contact area between the receiving vessel and the dropped silicon, the surface area of the solidified mass can be added.

In the above case, it is not particularly necessary to heat the vessel for receiving molten silicon. In order to allow the mass to contain bubbles effectively, the receiving vessel is desirably maintained at a temperature of not lower than 0° C. and lower than the melting point of silicon, preferably not lower than 0° C. and lower than 1200° C., most preferably not lower than 0° C. and lower than 1000° C. For the receiving vessel, various materials, such as metals, ceramics, glasses, silicon and carbon, can be used singly or in combination.

In order to prevent contamination of silicon, the material for at least a part of the receiving vessel that comes into contact with the molten silicon is preferably heat-resistant ceramic, quartz glass, carbon or silicon. Of these materials, most preferable is silicon or carbon. The part of the receiving vessel that comes into contact with the molten silicon has only to be made of silicon or carbon, and therefore, the receiving vessel may be made of silicon or carbon only, or a lining of silicon or carbon may be provided in the receiving vessel. For example, a lining of carbon may be provided in a receiving vessel made of silicon, or a lining of silicon may be provided in a receiving vessel made of carbon.

In the present invention, molten silicon is dropped, and it is preferable to carry out dropping of molten silicon in a hydrogen atmosphere and/or a nitrogen atmosphere because bubbles can be contained in the molten silicon. Hydrogen and nitrogen are dissolved in molten silicon, and when the silicon is solidified, they are deposited as bubbles, whereby the silicon can contain bubbles. As a result, a mass whose apparent density has been appropriately controlled can be obtained. Argon is hardly dissolved in molten silicon, so that bubbles are formed in small quantities, and if the dropping rate (receiving rate) of molten silicon is high, the apparent density cannot be sufficiently decreased on certain occasions.

In the present invention, the receiving vessel is allowed to receive the molten silicon at a mean rate of $1\times10^{-3}$ to $5\times10^{-1}$ g/sec·cm$^2$, preferably $1\times10^{-3}$ to $3.5\times10^{-1}$ g/sec·cm$^2$, most preferably $5\times10^{-3}$ to $3.5\times10^{-1}$ g/sec cm$^2$. When the molten silicon is dropped at such a mean rate, the dropped silicon does not become small particles and can be fusion-bonded to other dropped silicon to prepare a mass.

Through the above production process, a mass of silicon solidified from molten state having the aforesaid apparent density and compressive strength can be obtained.

Control of the apparent density and the compressive strength can be carried out by controlling the aforesaid receiving rate, temperature, dropping time (dropping rate and solidification rate), etc., so that it is difficult to mention it indiscriminately. However, it is thought that as the receiving rate is increased, a mass having higher apparent density and higher compressive strength is obtained, and as the receiving rate is decreased, a mass having lower apparent density and lower compressive strength is obtained.

As the molten silicon for use in the invention, silicon obtained by melting solid silicon such as an ingot may be used, but in order to reduce energy cost, it is preferable to directly produce a mass of silicon solidified from molten state during the process for producing a high-purity silicon material.

The molten silicon is more preferably molten silicon obtained by bringing hydrogen and silane into contact with each other on a deposition surface having a temperature of 600 to 1700° C. to deposit silicon in a solid state or a molten state and melting substantially all the deposited silicon.

The expression "substantially all" means that most of silicon is in a molten state though a part of silicon may be in a solid state.

Preferred examples of silanes include chlorosilanes containing hydrogen in a molecule, such as trichlorosilane and dichlorosilane. As the ratio of hydrogen to the chlorosilane, publicly known ratios are adoptable without any restriction.

It is particularly preferable to allow the shape of the molten silicon-receiving vessel to closely resemble a shape of a crucible used in an ingot-making step to thereby obtain a solidified mass having a shape close to the shape of the crucible, because the object of the invention is most effectively achieved.

The bubble-containing mass which is produced by the above production process can be packed as it is into a crucible in an ingot-making step, or in order to facilitate handling, the mass may be appropriately crushed or cut within limits described in the invention, prior to use.

In the present invention, even the silicon mass having a shape closely resembling a shape of a crucible undergoes self-breaking and is easily melted when the crucible is heated. Therefore, heat is easily conducted throughout the silicon, and melting does not require a long period of time. Consequently, the time for heating and holding the crucible is short, and moreover, a synergistic effect that energy cost can be reduced is also exhibited.

The apparatus for carrying out the process of the invention is not specifically restricted, and reaction apparatuses described in, for example, Japanese Patent Laid-Open Publication No. 316813/2002 are employable without any restriction. For example, a cylindrical vessel disclosed in Japanese Patent Laid-Open Publication No. 316813/2002, which has, at its lower end, an opening that becomes a removal opening, is used as a reaction vessel. To such a reaction vessel, a mixed gas of chlorosilane and a hydrogen gas are continuously fed, whereby silicon is continuously deposited. Although the heating means used herein is not specifically restricted provided that the temperature can be adjusted to the aforesaid temperature, a high-frequency coil or the like is usually employed. In order to enhance contact efficiency between the mixed gas as a raw material and the reaction vessel, a flow resistance increasing region means such as an orifice may be provided on an inner surface of the cylindrical vessel.

EXAMPLES

The present invention is further described with reference to the following examples, but it should be construed that the invention is in no way limited to those examples.

Example 1

A mixed gas of hydrogen and trichlorosilane was passed through a carbon cylinder, which had been heated to a temperature of 1200 to 1400° C., to deposit about 2 kg of silicon on the carbon inner wall surface. Then, in the same hydrogen atmosphere, the temperature of the carbon cylinder was raised to a melting point of silicon or higher to melt and drop the deposited silicon. From the beginning of dropping of a part of silicon to the completion of dropping of the whole amount of silicon, a period of about 10 minutes was required.

A silicon melt-receiving vessel made of stainless steel, which had been lined with a silicon plate having a thickness of 5 mm on the bottom surface and the side surface, was placed under the carbon cylinder at a distance of about 2.5 m from the carbon cylinder, and the molten silicon was received by the receiving vessel. The interior (lining) of the receiving vessel had a dimension of width 10 cm×depth 10 cm×height 50 cm.

When it is supposed that 2 kg of silicon having a true density is contained in the receiving vessel, the containment height is calculated to be about 8.6 cm. Therefore, the contact area of the receiving vessel with the silicon having been dropped under the above silicon dropping conditions was calculated to be 444 cm$^2$, that is, the total of the bottom surface area 100 cm$^2$ (10 cm×10 cm) and the side surface area 344 cm$^2$ (10 cm×8.6 cm)×4 faces. Because 2 kg of silicon was melted and dropped into the receiving vessel over a period of 10 minutes, the silicon-receiving rate of the receiving vessel was calculated as follows: 2000 g/600 sec/400 cm$^2$=7.5×10$^{-3}$ g/sec cm$^2$.

The silicon mass obtained by dropping molten silicon and receiving it by the recovery vessel was solidified, then taken out of the vessel and measured as such on its apparent density. As a result, the apparent density was 1.85 g/cm$^3$. The mass was appropriately crushed, then 10 crushed fragments were selected at random, and each of the fragments was further processed to a cube having a length of one side of 1 cm, followed by measurement of a compressive strength. As a result, the compressive strength was 25 MPa on an average.

A silicon mass of 10 kg produced under the same conditions as above was appropriately crushed so as to obtain crushed fragments each having a volume of 50 to 100 cm$^3$, and the fragments were packed into a crucible of a small-sized casting apparatus. Thereafter, gaps among the thus packed fragments were further packed with crushed fragments of 1 to 5 mm. The packing was heated and melted, and as a result, the time required for melting all the silicon solids was about 70 minutes.

As can be seen from comparison with the later-described comparative examples, the time required for melting in this example was extremely shorter. This indicates that it is possible to reconcile rapid temperature rise and rapid melting in an ingot-making step.

Example 2

In a heat-melting oven of a hydrogen atmosphere, 20 kg of silicon was melted, and then the whole amount of the molten silicon was dropped into a receiving vessel placed 2.5 m under the oven over a period of 30 seconds.

Although the constitution of the receiving vessel was the same as that in Example 1, the silicon lining plate had an internal dimension of width 20 cm×depth 20 cm×height 1 m.

The same calculation as in Example 1 was carried out. As a result, the contact area of the receiving vessel with the silicon having been dropped under the above silicon dropping conditions was about 2120 cm$^2$, and the silicon-receiving rate of the receiving vessel was $3.1 \times 10^{-1}$ g/sec cm$^2$.

The silicon mass obtained by dropping molten silicon and receiving it by the recovery vessel was solidified, then taken out of the vessel and measured on its apparent density. As a result, the apparent density was 2.13 g/cm$^3$. The compressive strength of the mass was 40 MPa.

The resulting silicon mass was crushed and packed in the same manner as in Example 1, and melting by heating was carried out in the same small-sized casting apparatus as in Example 1. As a result, the time required for melting all the silicon solids was about 70 minutes.

Comparative Example 1

Using the same silicon deposition reaction apparatus as in Example 1, the carbon cylinder was heated to 1500 to 1700° C. to perform deposition of silicon. Simultaneously with deposition, the silicon was melted and dropped one after another. The silicon production rate was about 14 g/min, and silicon in the total amount of 2 kg was produced and dropped.

A silicon-receiving vessel having the same conditions as in Example 1 was placed, and the molten silicon was dropped and received.

The same calculation as in Example 1 was carried out. As a result, the contact area of the receiving vessel with the silicon having been dropped under the above silicon dropping conditions was 444 cm$^2$ similarly to Example 1, and the silicon-receiving rate of the receiving vessel was $5.3 \times 10^{-4}$ g/sec cm$^2$.

The silicon obtained by dropping molten silicon and receiving it by the recovery vessel was solidified, then taken out of the vessel and measured on its apparent density. As a result, the apparent density was 1.65 g/cm$^3$. The compressive strength was 3 MPa.

Silicon produced under the same conditions as above was crushed and packed in the same manner as in Example 1, and melting by heating was carried out in the same small-sized casting apparatus as in Example 1. As a result, the time required for melting all the silicon solids was about 90 minutes.

Comparative Example 2

Using the same apparatus as in Example 2, 20 kg of silicon was melted in a melting atmosphere of argon. Thereafter, the whole amount of molten silicon was dropped into a receiving vessel placed 2.5 m under the oven over a period of 30 seconds.

The receiving vessel was the same as in Example 2. That is to say, the contact area of the receiving vessel with the silicon having been dropped under the above silicon dropping conditions was about 2120 cm$^2$, and the silicon-receiving rate of the receiving vessel was $6.3 \times 10^{-1}$ g/sec cm$^2$.

The silicon mass obtained by dropping molten silicon and receiving it by the recovery vessel was solidified, then taken out of the vessel and measured on its apparent density. As a result, the apparent density was 2.31 g/cm$^3$. The compressive strength of the mass was 60 MPa.

The resulting silicon mass was crushed and packed in the same manner as in Example 1, and melting by heating was carried out in the same small-sized casting apparatus as in Example 1. As a result, the time required for melting all the silicon solids was about 120 minutes.

Comparative Example 3

A graphite cylinder having an inner diameter of 50 mm, a length of 300 mm and a thickness of 10 mm was heated to about 1400° C. at high frequencies of 8 kHz, and hydrogen and trichlorosilane were fed to the cylinder to deposit silicon. When about 370 g of silicon was deposited, the temperature of the graphite cylinder was raised to 1500° C. to drop the deposit. The recovered silicon was in such a state that only the contact surface with graphite was melted but most of other parts were not melted and dropped as a solid.

The apparent density of the recovered silicon was about 2.32 g/cm$^3$, and the compressive strength was about 70 MPa.

A silicon mass produced under the same conditions as above was crushed and packed in the same manner as in Example 1, and melting by heating was carried out in the same small-sized casting apparatus as in Example 1. As a result, the time required for melting all the silicon solids was about 120 minutes.

Comparative Example 4

In a closed vessel, a V-shaped graphite bar having a diameter of 20 mm and a length on one side of 300 mm was arranged, and an alternating current was applied to the graphite bar to heat it to about 1300° C. Then, hydrogen and trichlorosilane were fed to the closed vessel to deposit about 250 g of silicon on the V-shaped bar. Thereafter, the current applied was increased, and as a result, almost the whole amount of the silicon deposit was melted and dropped.

The apparent density of silicon recovered in a recovery vessel made of silicon was 1.6 g/cm$^3$, and the compressive strength was 2 MPa.

Silicon produced under the same conditions as above was crushed and packed in the same manner as in Example 1, and melting by heating was carried out in the same small-sized casting apparatus as in Example 1. As a result, the time required for melting all the silicon solids was about 100 minutes.

The invention claimed is:

1. A mass of silicon solidified from molten state, which is a silicon solidified mass produced by dropping molten silicon into a receiving vessel and allowing the vessel to receive the molten silicon, said solidified mass containing bubbles and having:
   (i) an apparent density of not less than 1.5 g/cm$^3$ and not more than 2.3 g/cm$^3$, and
   (ii) a compressive strength of not less than 5 MPa and not more than 50 MPa, the compressive strength being an average of ten samples of cubes of said solidified mass, each cube having a length of one side of 1 cm.

2. The mass of silicon solidified from molten state as claimed in claim 1, which has a volume of not less than 50 cm$^3$.

* * * * *

UNITED STATES PATENT AND TRADEMARK OFFICE
CERTIFICATE OF CORRECTION

| | |
|---|---|
| PATENT NO. | : 7,871,590 B2 |
| APPLICATION NO. | : 11/597222 |
| DATED | : January 18, 2011 |
| INVENTOR(S) | : Wakamatsu et al. |

It is certified that error appears in the above-identified patent and that said Letters Patent is hereby corrected as shown below:

Column 2, line 48, "Japanese Paten" should read -- Japanese Patent --

Column 3, lines 60, 62 and 64, "Japanese Paten Patent" should read
-- Japanese Patent --

Column 4, lines 1 and 2, delete the following titles:
"DISCLOSURE OF THE INVENTION Problems to be Solved the Invention"

Column 4, line 27, "Based on the fining finding" should read -- Based on the finding --

Signed and Sealed this
Third Day of May, 2011

David J. Kappos
*Director of the United States Patent and Trademark Office*